(12) United States Patent
Yoon et al.

(10) Patent No.: US 9,911,660 B2
(45) Date of Patent: Mar. 6, 2018

(54) METHODS FOR FORMING GERMANIUM AND SILICON GERMANIUM NANOWIRE DEVICES

(71) Applicant: Lam Research Corporation, Fremont, CA (US)

(72) Inventors: Hyungsuk Alexander Yoon, San Jose, CA (US); Zhongwei Zhu, Sunnyvale, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/138,796

(22) Filed: Apr. 26, 2016

(65) Prior Publication Data

US 2017/0309521 A1    Oct. 26, 2017

(51) Int. Cl.
| | | |
|---|---|---|
| H01L 21/00 | (2006.01) | |
| H01L 21/8234 | (2006.01) | |
| H01L 21/02 | (2006.01) | |
| H01L 21/311 | (2006.01) | |
| H01L 21/324 | (2006.01) | |
| H01L 21/3105 | (2006.01) | |
| H01L 21/321 | (2006.01) | |
| H01L 21/28 | (2006.01) | |
| H01L 29/06 | (2006.01) | |

(52) U.S. Cl.
CPC .. *H01L 21/823487* (2013.01); *H01L 21/0228* (2013.01); *H01L 21/0257* (2013.01); *H01L 21/02381* (2013.01); *H01L 21/02532* (2013.01); *H01L 21/02598* (2013.01); *H01L 21/02603* (2013.01); *H01L 21/28255* (2013.01); *H01L 21/31055* (2013.01); *H01L 21/31111* (2013.01); *H01L 21/324* (2013.01); *H01L 21/3212* (2013.01); *H01L 29/0676* (2013.01)

(58) Field of Classification Search
None
See application file for complete search history.

(56) References Cited

U.S. PATENT DOCUMENTS

| | | |
|---|---|---|
| 5,770,982 A | 6/1998 | Moore |
| 5,952,896 A | 9/1999 | Mett et al. |
| 6,054,013 A | 4/2000 | Collins et al. |
| 6,254,738 B1 | 7/2001 | Stimson et al. |
| 6,313,584 B1 | 11/2001 | Johnson et al. |
| 7,218,899 B2 | 5/2007 | Sorrells et al. |
| 7,480,571 B2 | 1/2009 | Howald et al. |
| 7,539,474 B2 | 5/2009 | Sorrels et al. |
| 7,759,254 B2 | 7/2010 | Sasaki et al. |
| 7,780,814 B2 | 8/2010 | Pipitone et al. |

(Continued)

OTHER PUBLICATIONS

U.S. Appl. No. 14/735,541, filed Jun. 10, 2015, filed Kim et al.

(Continued)

*Primary Examiner* — Evren Seven (57) ABSTRACT

A method for forming nanowire semiconductor devices includes a) providing a substrate including an oxide layer defining vias; and b) depositing nanowires in the vias. The nanowires are made of a material selected from a group consisting of germanium or silicon germanium. The method further includes c) selectively etching back the oxide layer relative to the nanowires to expose upper portions of the nanowires; and d) doping the exposed upper portions of the nanowires using a dopant species.

10 Claims, 7 Drawing Sheets

(56) References Cited

U.S. PATENT DOCUMENTS

| | | | |
|---|---|---|---|
| 7,811,410 B2 | 10/2010 | Leming et al. | |
| 7,981,779 B2 | 7/2011 | Sasaki et al. | |
| 8,900,951 B1* | 12/2014 | Cheng | H01L 29/0673 257/E21.453 |
| 9,059,678 B2 | 6/2015 | Long et al. | |
| 9,543,150 B2 | 1/2017 | Kim et al. | |
| 2004/0027209 A1 | 2/2004 | Chen et al. | |
| 2005/0277273 A1 | 12/2005 | Sasaki et al. | |
| 2009/0124053 A1* | 5/2009 | Nikoobakht | B82Y 10/00 438/197 |
| 2011/0023955 A1* | 2/2011 | Fonash | B82Y 20/00 136/256 |
| 2011/0309354 A1* | 12/2011 | Wang | H01L 21/02472 257/43 |
| 2012/0238074 A1 | 9/2012 | Santhanam et al. | |
| 2013/0135058 A1 | 5/2013 | Long et al. | |
| 2014/0011347 A1 | 1/2014 | Yerushalmi et al. | |
| 2014/0099774 A1 | 4/2014 | Vincent | |
| 2015/0303332 A1* | 10/2015 | Chang | B82Y 30/00 136/256 |
| 2015/0311072 A1* | 10/2015 | Aagesen | H01L 21/02381 257/618 |
| 2016/0336177 A1* | 11/2016 | Holland | H01L 29/0676 |
| 2016/0365251 A1 | 12/2016 | Kim et al. | |
| 2017/0077264 A1* | 3/2017 | Basker | H01L 29/66522 |
| 2017/0104062 A1* | 4/2017 | Bi | H01L 29/66545 |
| 2017/0148947 A1* | 5/2017 | Lee | H01L 33/06 |
| 2017/0170018 A1 | 6/2017 | Kim et al. | |

OTHER PUBLICATIONS

U.S. Appl. No. 14/967,994, filed Dec. 14, 2015, filed Kim et al.

Park, J.-S. et al.; "Defect Reduction of Selective Ge Epitaxy in Trenches on Si(001) Substrates Using Aspect Ratio Trapping"; Appl. Phys. Lett. 90, 052113 (2007); 4 pages.

Sasaki, Yuichiro, "A Study on Conformal Plasma Doping Process with Self-Regulating Characteristics for Source/Drain Extension"; Mar. 2012; 113 pages.

Wikipedia; "Monolayer Doping"; downloaded from http://en.wikipedia.org/wiki/Monolayer_doping, last modified Jun. 16, 2015; 2 pages.

Notice of Allowance and Fees Due, dated Aug. 31, 2016, for U.S. Appl. No. 14/735,541, filed Jun. 10, 2015.

* cited by examiner

METHODS FOR FORMING GERMANIUM AND SILICON GERMANIUM NANOWIRE DEVICES

FIELD

The present disclosure relates to substrate processing systems, and more particularly to systems and methods for forming germanium and silicon germanium nanowire devices.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to anneal, deposit and etch film on a substrate such as a semiconductor wafer. The substrate processing systems for deposition and etching typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

Further scaling of transistors will require materials to replace silicon (Si) in transistor channels. Use of germanium (Ge) and silicon germanium (SiGe), particularly with strain, have been proposed for future generations of transistors. Growth of strained Ge or SiGe nanowires or nanowires that are several nanometers wide is a prerequisite for using these materials in FinFET and gate-all-around (GAA) devices. The Ge or SiGe nanowires need to be defect-free to ensure high carrier mobility in the channel.

There is a 4.2% lattice mismatch between Ge and Si. Therefore, direct epitaxial growth of Ge or SiGe on Si leads to a dislocation density of $\sim 10^8$ cm$^{-2}$, which causes degradation in device performance. Thick composition-graded $Si_{1-x}Ge_x$ buffer layers can be used to decrease the dislocation density. However, these buffer layers have a thickness on the order of hundreds of nanometers, which is not consistent with scaling of transistors.

Aspect ratio trapping (ART) methods have been used to deposit materials in narrow trenches on silicon substrates. Dislocation defects originating at an interface between Si and Ge or SiGe are trapped in a bottom portion of a trench. Ideally, the top portion of the trench is defect free. In practice, however, the defects tend to propagate to a top surface of Ge or SiGe along the length direction of trenches.

SUMMARY

A method for forming nanowire semiconductor devices includes a) providing a substrate including an oxide layer defining vias; b) depositing nanowires in the vias, wherein the nanowires are made of a material selected from a group consisting of germanium or silicon germanium; c) selectively etching back the oxide layer relative to the nanowires to expose upper portions of the nanowires; and d) doping the exposed upper portions of the nanowires using a dopant species.

In other features, the method includes e) annealing the substrate. The nanowires are single-crystalline. The substrate includes a silicon layer. The oxide layer is deposited on the silicon layer and the oxide layer is patterned to define the vias.

In other features, the method includes e) depositing gate dielectric layers on the exposed upper portions of the nanowires. The method includes f) depositing oxide film on the substrate to perform gap fill; and g) performing chemical mechanical polishing of the oxide film.

In other features, the method includes h) defining masked and unmasked areas in the oxide film. The unmasked areas are located adjacent to gate areas corresponding to the gate dielectric layers. The method further includes i) etching the unmasked areas to create gate openings.

In other features, the method further includes j) performing metallization to fill the gate openings with gate metal; and k) performing chemical mechanical polishing on the gate metal.

In other features, the doping in d) is performed using a process selected from a group consisting of a plasma process and an atomic layer deposition (ALD) process. Depositing gate dielectric layers in e) is performed using an atomic layer deposition (ALD) process.

A method for forming nanowire semiconductor devices includes a) providing a substrate including an oxide layer defining vias; b) depositing a first portion of nanowires in the vias, wherein the first portion of the nanowires is made of a material selected from a group consisting of germanium or silicon germanium; and c) depositing and performing in-situ doping of a second portion of the nanowires in the vias. The second portion of the nanowires is made of the material and is doped by a first dopant species. The method further includes d) selectively etching back the oxide layer relative to the nanowires to expose upper portions of the nanowires.

In other features, the method includes e) annealing the substrate. The nanowires are single-crystalline. The substrate includes a silicon layer. The oxide layer is deposited on the silicon layer and the oxide layer is patterned to define vias.

In other features, after c) and before d), the method includes c1) depositing and performing in-situ doping of a third portion of the nanowires in the vias. The third portion of the nanowires is made of the material and is doped by a second dopant species.

In other features, after c) and before d), the method includes c1) depositing a third portion of the nanowires in the vias. The third portion of the nanowires is made of the material and is undoped.

In other features, the method includes e) depositing gate dielectric layers on the exposed upper portions of the nanowires. The method includes f) depositing oxide film to perform gap fill; and g) performing chemical mechanical polishing of the oxide film.

In other features, the method includes h) defining masked and unmasked areas in the oxide film. The unmasked areas are located adjacent to gate areas corresponding to the gate dielectric layers. The method includes i) etching the unmasked areas to create gate openings.

In other features, the method includes j) performing metallization to fill the gate openings with gate metal; and k) performing chemical mechanical polishing of the gate metal.

In other features, depositing gate dielectric layers in f) is performed using an atomic layer deposition (ALD) process.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The method according to the present disclosure may be performed on a substrate including a silicon layer and an oxide layer (such as $SiO_2$) that is patterned to form vias. In some examples, an aspect ratio of the vias is greater than or equal to 1.5 to ensure that top portions of the nanowires are free from defects. For example, aspect ratios of 3:1, 4:1, 5:1, 6:1 or greater can be used.

Single-crystalline Ge or SiGe nanowires are selectively grown as undoped pillars on the substrate in vias of the substrate. Defects due to lattice mismatch originating at an interface between the Si and Ge or SiGe are trapped at sidewalls of the vias, regardless of the direction of defect propagation. Any overgrown portion of the Ge or SiGe nanowires above the oxide layer can be planarized during subsequent CMP.

Portions of the Ge or SiGe nanowires can be doped to further enhance carrier mobility. In one example, sidewalls of the vias are partially etched back to expose upper portions of the Ge or SiGe nanowires. The exposed upper portions of the Ge or SiGe nanowires are subsequently doped. In some examples, the doping is performed using a plasma process or an atomic layer deposition (ALD) process, although other processes may be used. In some examples, the plasma or ALD process is followed by an annealing process to repair surfaces of the Ge or SiGe nanowires and/or to diffuse dopants.

In another example, a first (or lower) portion of the Ge or SiGe nanowires is deposited during aspect ratio trapping (ART). Then, in-situ doping of a second portion of the Ge or SiGe nanowires is performed. The second portion of the Ge or SiGe nanowires may fully or partially complete deposition of the vias. If the second portions of the Ge or SiGe nanowires only partially complete the vias, undoped Ge or SiGe nanowires may complete a third or upper portion of the nanowires. Alternately, a different dopant (different than the dopant species used for the first portion and/or a different doping concentration) may be used during deposition of the third or upper portion of the Ge or SiGe nanowires.

After plasma or ALD doping, the nanowires are optionally annealed to repair surfaces and/or diffuse dopants. A gate dielectric layer is subsequently deposited on the exposed surface of Ge or SiGe nanowires. In some examples, the gate dielectric layer is deposited using an atomic layer deposition (ALD) process, although other processes may be used. Gap fill oxide is then deposited to fill gaps between the Ge or SiGe nanowires. After planarization by CMP, the oxide above the gate dielectric material is masked and etched to create gate openings adjacent to the gate areas.

Metallization is then performed to deposit a gate metal layer in the gate openings. Subsequently, the substrate is planarized using CMP.

Figure 1:
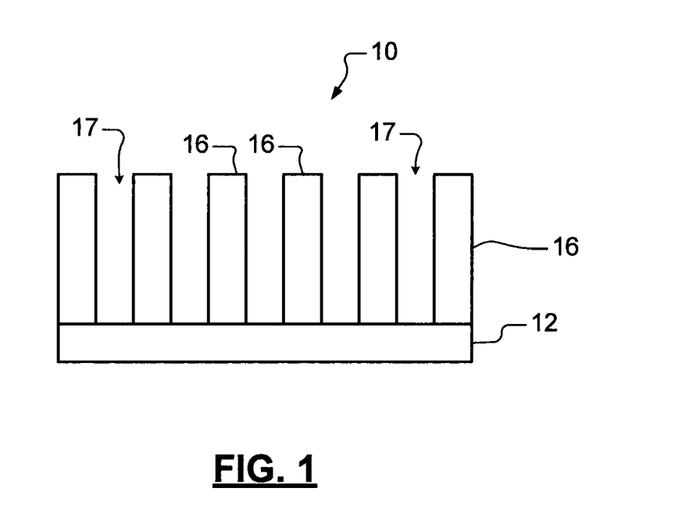
FIG. 1 is a side view illustrating an example of a substrate including a silicon layer and an oxide layer that is patterned to define vias according to the present disclosure.

Referring now to FIG. 1-4, forming of Ge or SiGe nanowires is shown. In FIG. 1, a substrate 10 includes a silicon (Si) layer 12 and an oxide layer 16 that is patterned to define vias 17. In some examples, the oxide layer 16 includes silicon dioxide ($SiO_2$).

In some examples, pretreatment may be performed to remove native oxide on the silicon layer 12 prior to Ge or SiGe growth. In some examples, the pretreatment includes dipping the substrate in diluted hydrofluoric (HF) acid for a first predetermined period followed by annealing at a predetermined temperature for a second predetermined period. In some examples, the HF acid is diluted by water in a range from 90:1 to 110:1 (e.g. 100:1). In some examples, the first predetermined period is between 15 seconds (s) and 120 s (e.g. 30 s). In some examples, the second period is between 30 s and 30 minutes (e.g. 60 s). In some examples, the predetermined temperature is in a range from 850° C. to 950° C. (e.g. 900° C.). In some examples, annealing is performed in vacuum. In some examples, annealing is performed in hydrogen gas ($H_2$). In other examples, RF plasma may be used during the pretreatment process, as will be described below.

Figure 2:
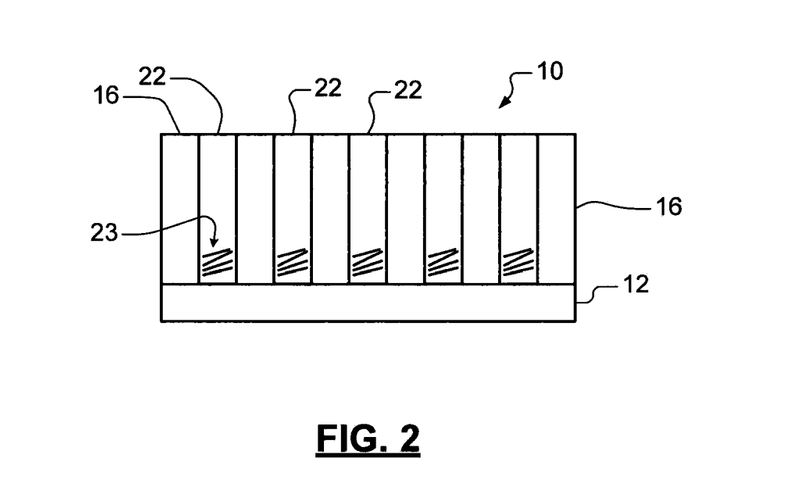
FIG. 2 is a side view illustrating an example of the substrate including Ge or SiGe nanowires deposited in the vias according to the present disclosure.

In FIG. 2, the substrate 10 is shown after Ge or SiGe nanowires 22 are thermally grown in a portion of the vias 17. In some examples, defects 23 that form at a bottom of the Ge or SiGe nanowires 22 are trapped by sidewalls of the vias 17.

Figure 3:
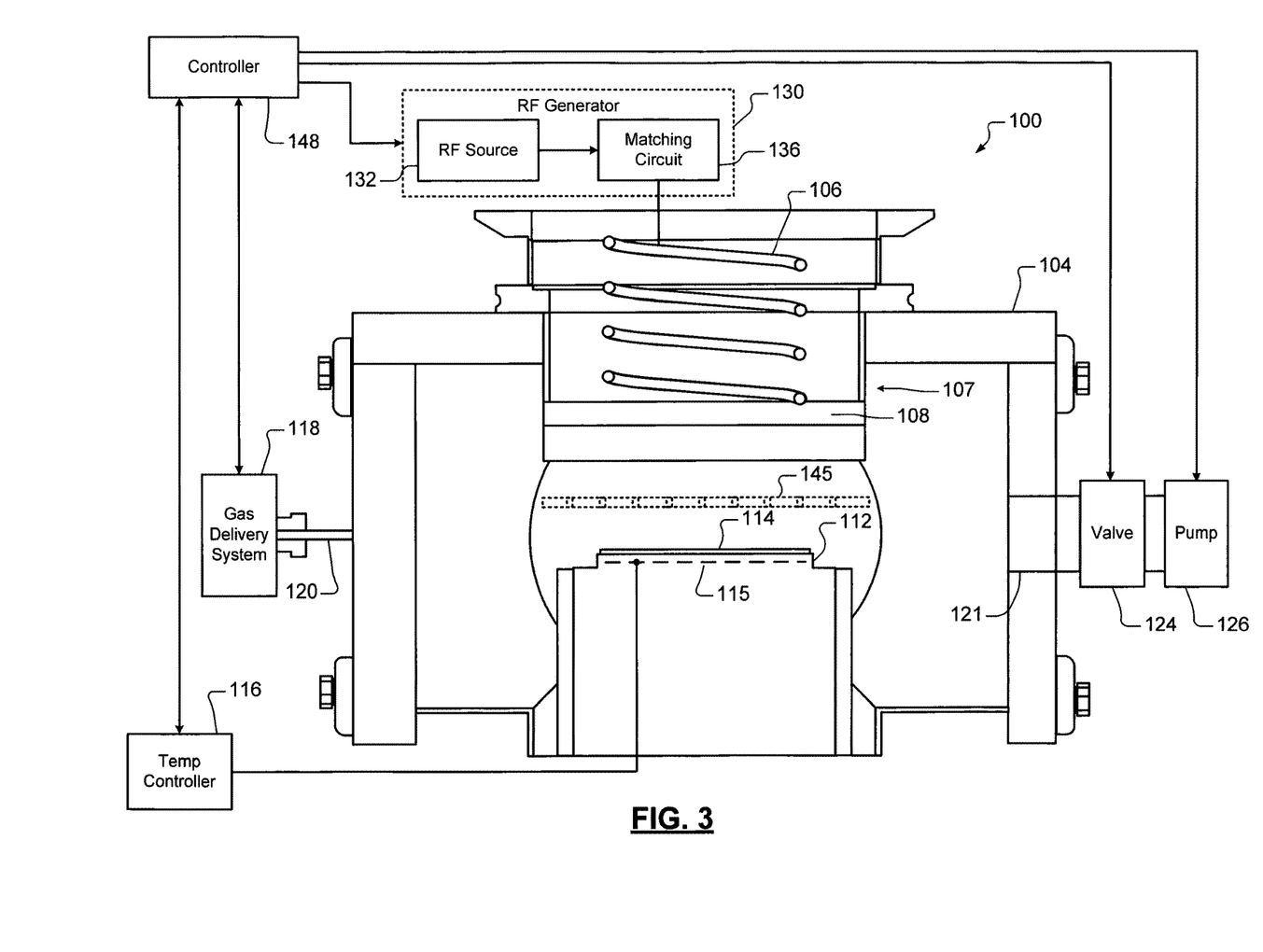
FIG. 3 is a functional block diagram of an example of a substrate processing chamber for depositing the Ge or SiGe nanowires.

Referring now to FIG. 3, an example of a suitable substrate processing system 100 for performing pretreatment described above and/or growing Ge or SiGe nanowires is shown. While a specific example of a substrate processing system is shown and described herein, various other types of substrate processing systems may be used. The substrate processing system 100 includes a processing chamber 104. An inductive coil 106 is arranged adjacent to an upper portion of the processing chamber 104. In some examples, the inductive coil 106 includes a helical inductive coil. In other examples, the inductive coil 106 includes a flat inductive coil. In some examples, the inductive coil 106 extends inwardly into the processing chamber 104 beyond an upper inner surface thereof as shown at 107. In some examples, a window 108 is arranged between the inductive coil 106 and an inner portion of the processing chamber 104. In some examples, the window 108 is made of a material selected from a group consisting of alumina, quartz or silicon.

A substrate support 112 such as a pedestal, electrostatic chuck (ESC), etc. is arranged inside of the processing chamber 104. The substrate support 112 may include a heater 115, one or more cooling channels flowing coolant (not shown), or other devices that may be used to control a temperature of the substrate 114 during processing. A temperature controller 116 may be used to monitor a temperature of the pedestal 112 and/or substrate 114 using one or more temperature and/or flow rate sensors (not shown) and to control the temperature thereof.

A gas delivery system 118 communicates with one or more gas sources and includes one or more valves, mass flow controllers and manifolds (all not shown) to deliver predetermined process gas mixtures to a gas inlet 120 of the processing chamber 104. The process gases may include carrier gases, gas precursors for Ge and SiGe and dopant species, and other gases. A gas outlet 121 of the processing chamber 104 is used to evacuate reactants from the processing chamber 104.

A valve 124 and a pump 126 may be used to remove the reactants from the processing chamber 104. In some examples, the pump 126 may be a turbomolecular pump, although other types of pumps may be used. The pump 126 may also be used to control pressure within the processing chamber. A pressure sensor (not shown) may be arranged in the processing chamber and used to provide feedback relating to the pressure within the processing chamber 104. An RF generator 130 includes an RF source 132 and a matching circuit 136. The RF generator 130 selectively supplies RF power to the coil 106 to create plasma within the processing chamber 104.

A controller 148 communicates with the temperature controller 116, the gas delivery system 118, the valve 124 and pump 126, and the RF generator 130. The controller 148 controls process temperature and pressure, delivery of RF power (when used to create RF plasma) and gases to the processing chamber 104, and evacuation of reactants from the processing chamber, as will be described further below.

In some examples, Ge nanowires are grown using a thermal process without plasma at a substrate temperature in a range between 400° C. and 600° C. Precursor gas including germane ($GeH_4$) is supplied to the processing chamber. A carrier gas such as molecular hydrogen ($H_2$), argon (Ar) or a mixture thereof is supplied to the processing chamber. In some examples, a $GeH_4/H_2$ ratio is supplied to the chamber at a ratio in a predetermined range from 1:1 to 1:100 (e.g. 1:10). In some examples, chamber pressure is maintained in a range from 0.5 to 5 Torr. In some examples, a process reaction time is in a range from 5 to 60 minutes.

RF plasma may be used during pretreatment either alone or in conjunction with the HF acid dip. In some examples, the process temperature during the pretreatment is in a temperature range between 20° C. and 500° C. In some examples, the process pressure during the pretreatment is in a pressure range between 30 mTorr and 200 mTorr. In some examples, a process gas mixture during the pretreatment includes nitrogen trifluoride ($NF_3$) only or argon (Ar) and $NF_3$. In some examples, the ratio of $Ar/NF_3$ during the pretreatment is in a range from 1:1 to 10:1. In some examples, RF power during the pretreatment is in a range from 50 W to 500 W. In some examples, the process period during the pretreatment is in a range from 15 s to 10 min. In other examples, RF plasma is used in combination with the diluted HF acid pretreatment. In other words, the substrate is first pretreated with diluted HF acid as described above followed by the RF plasma process. In some examples, an optional downstream plasma showerhead (at 145 in FIG. 3) is arranged between the window 108 and the substrate support in FIG. 3 to minimize plasma damage on the substrate. In some examples, the showerhead 145 includes a plate defining a plurality of spaced through holes.

Figure 4:
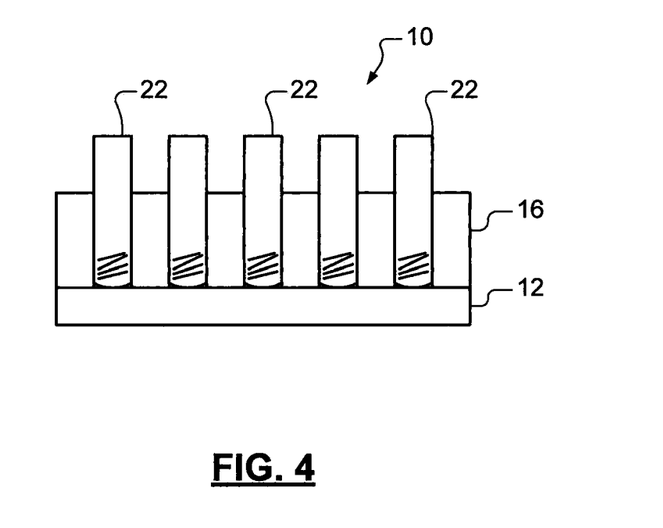
FIG. 4 is a side view illustrating an example of the substrate after the oxide layer is etched back to expose upper portions of the Ge or SiGe nanowires according to the present disclosure.

In FIG. 4, the substrate 10 is shown after the oxide layer 16 is selectively etched back relative to the Ge or SiGe nanowires to expose upper portions of the Ge or SiGe nanowires 22. In some examples, the oxide layer 16 is etched at a high ratio relative to the Ge or SiGe. In some examples, the selectivity is greater than 5:1, 10:1, 50:1 or 100:1. In some examples, the selective etching is performed by wet etching using diluted HF acid. In some examples, the HF acid is diluted by water to a ratio between 10:1 and 100:1.

Figure 5:
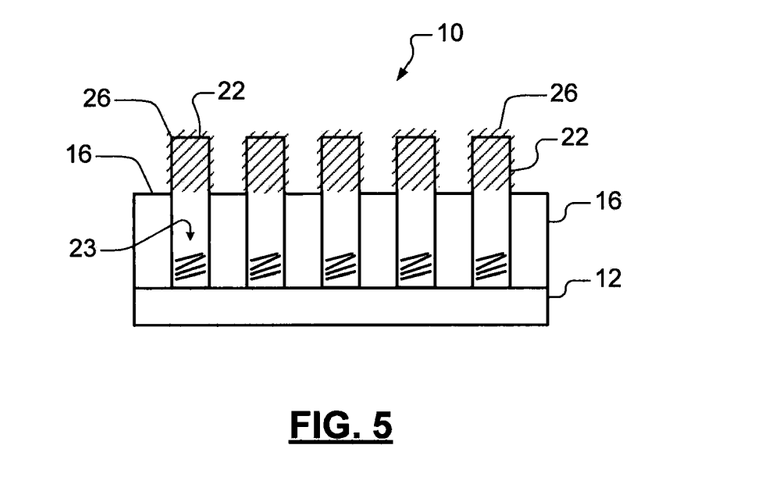
FIG. 5 is a side view illustrating an example of the substrate after doping of the exposed upper portions of the Ge or SiGe nanowires according to the present disclosure.
Figure 6:
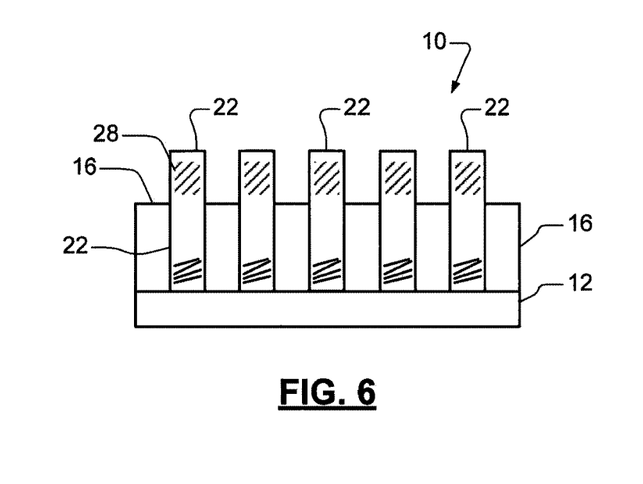
FIG. 6 is a side view illustrating an example of the substrate after annealing to enhance surfaces and/or diffuse dopants according to the present disclosure.
Figure 7:
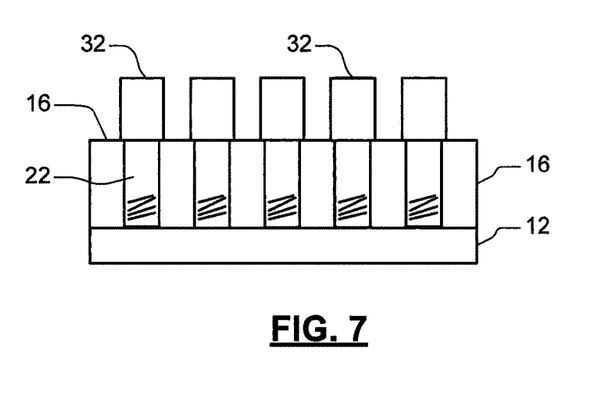
FIG. 7 is a side view illustrating an example of the substrate after deposition of a gate dielectric layer on the exposed upper portions of the Ge or SiGe nanowires according to the present disclosure.

Referring now to FIGS. 5-7, additional processing of the substrate 10 including doping, annealing, and deposition of gate dielectric film is shown. In FIG. 5, the exposed upper portions are doped. In some examples, plasma or ALD doping is performed as shown at 26.

For example only, suitable doping processes are shown and described in commonly-assigned "Conformal Doping Using Dopant Gas on Hydrogen Plasma Treated Surface" U.S. patent application Ser. No. 14/967,994, filed on Dec. 14, 2015; and "Systems and Methods for Forming Ultra-Shallow Junctions", U.S. patent application Ser. No. 14/735,541, filed on Jun. 10, 2015, which are both incorporated herein by reference in their entirety.

In some examples, dopants such as boron (B), indium (In), phosphorous (P), arsenic (As), antimony (Sb), etc. are deposited, although other doping species may be used. In FIG. 6, the substrate 10 is annealed as shown at 28 to prepare surfaces and/or diffuse the dopants. In FIG. 7, the substrate 10 is shown after deposition of a gate dielectric layer 32. In some examples, the gate dielectric layer 32 is deposited using ALD. In some examples, the gate dielectric layer may be made of a high-k dielectric material such as $SiO_2$, hafnium dioxide ($HfO_2$), or other material.

Figure 8:
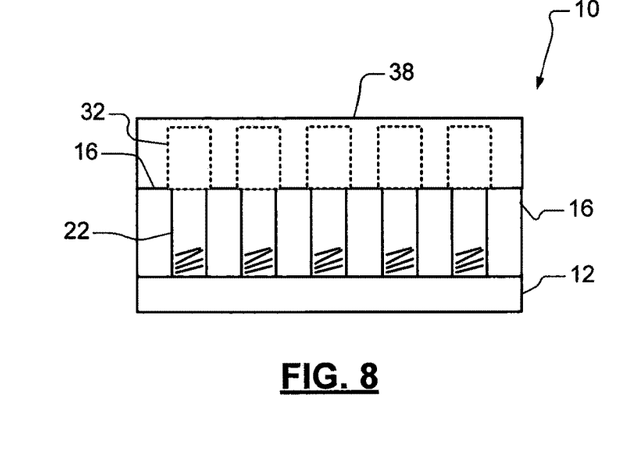
FIG. 8 is a side view illustrating an example of the substrate after gap fill with oxide and chemical mechanical polishing (CMP) according to the present disclosure.
Figure 9:
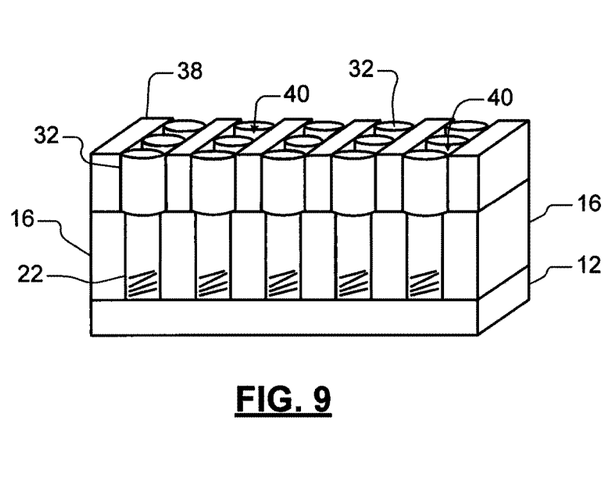
FIG. 9 is a perspective view illustrating an example of the substrate after masking and etching of gate openings in the oxide around the gates areas according to the present disclosure.
Figure 10:
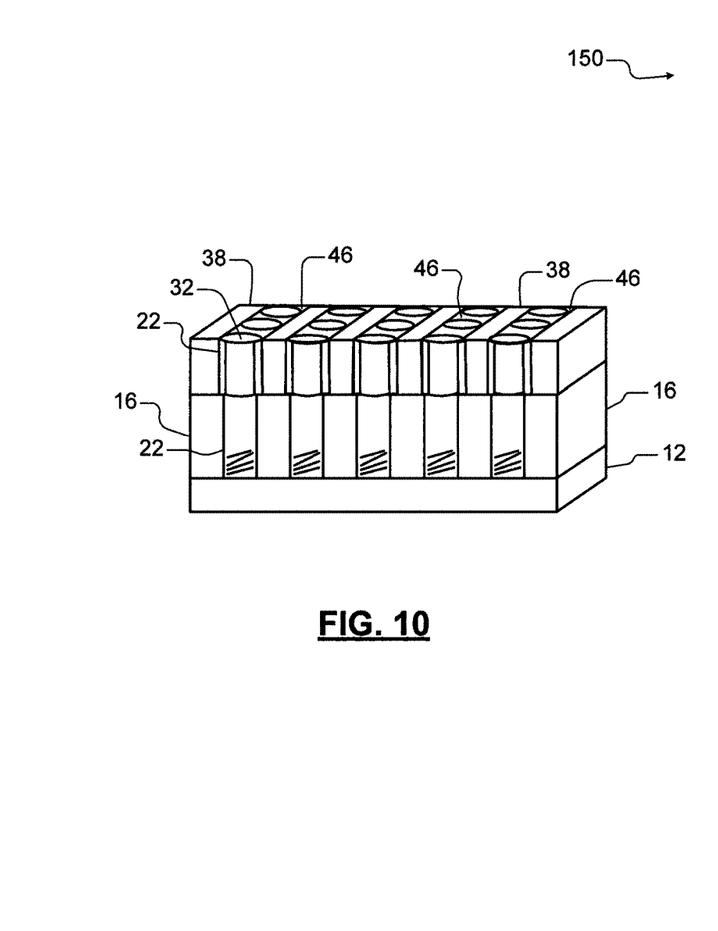
FIG. 10 is a perspective view illustrating an example of the substrate after metallization in the gate openings and CMP according to the present disclosure.

Referring now to FIGS. 8-10, additional processing of the substrate 10 is shown. In FIG. 8, the substrate 10 is shown after deposition of a gap fill layer 38. Chemical mechanical polishing (CMP) of the gap fill layer 38 may be performed.

In some examples, the gap fill layer 38 includes oxide film such as $SiO_2$, although other types of film can be used.

In FIG. 9, the substrate 10 is shown after masking and etching of the gap fill layer 38 to create gate openings 40 around gate areas corresponding to the gate dielectric layers 32. In FIG. 10, the substrate 10 is shown after metallization is used to deposit metal 46 in the gate openings 40. After metallization, CMP may be performed.

Figure 11:
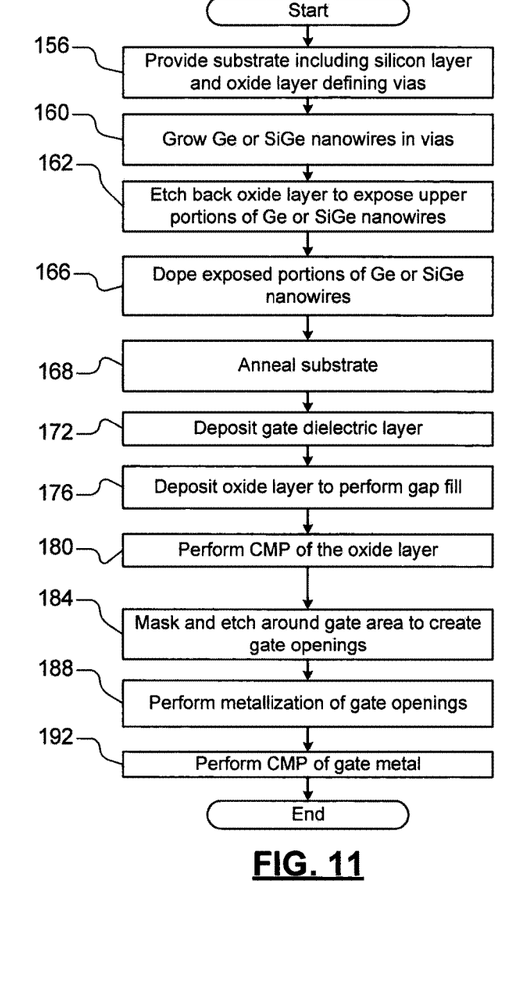
FIG. 11 is a flowchart illustrating an example of a method for forming devices including Ge or SiGe nanowires according to the present disclosure.

Referring now to FIG. 11, a method 150 for forming devices including Ge or SiGe nanowires is shown. At 156, a substrate is provided that includes a silicon layer and a dielectric layer defining a plurality of vias. At 160, the vias are filled with Ge or SiGe nanowires. At 162, the oxide layer is etched back to expose upper portions of the Ge or SiGe nanowires.

At 166, the exposed upper portions of the Ge or SiGe nanowires are doped. In some examples, the doping is performed using plasma doping or ALD doping, although other doping methods may be used. At 168, the substrate is annealed to repair surfaces and/or enhance dopant diffusion.

At 172, a gate dielectric layer is deposited on the upper portions of the Ge or SiGe nanowires. In some examples, the gate dielectric layer is deposited using ALD, although other processes may be used. At 176, oxide gap fill is performed. At 180, chemical mechanical polishing (CMP) is performed. At 184, the gap fill oxide is masked and etched around the gate areas to create gate openings. At 188, metallization is performed to fill the gate openings with gate metal. At 192, CMP is performed on the gate metal.

Figure 12:
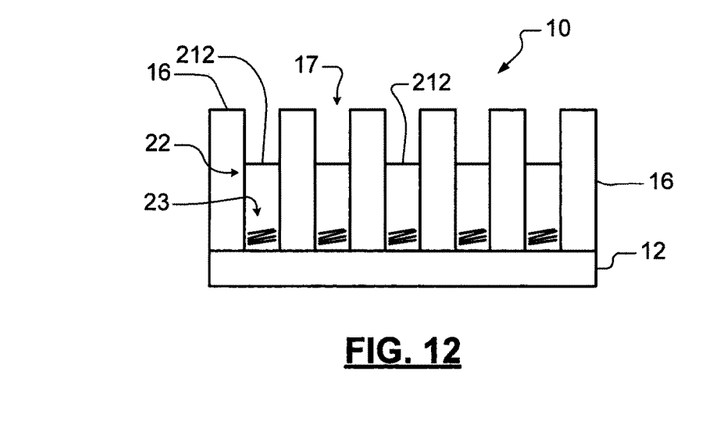
FIG. 12 is a side view illustrating another example of a substrate including a first undoped portion of Ge or SiGe nanowires according to the present disclosure.
Figure 13:
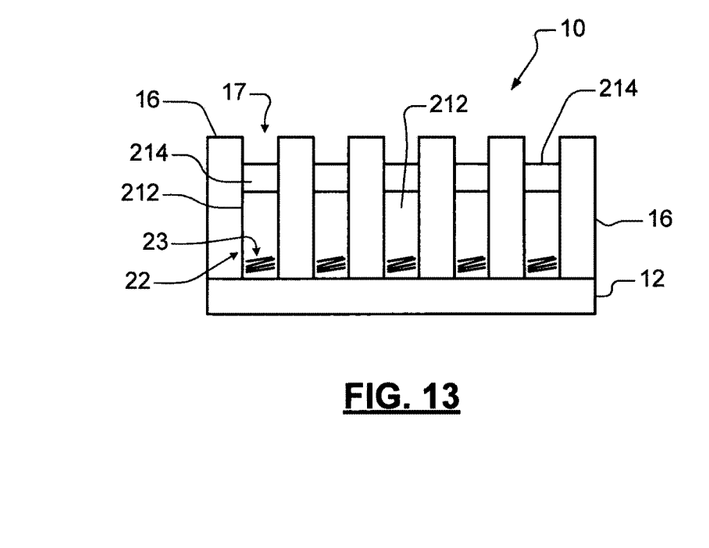
FIG. 13 is a side view illustrating the substrate of FIG. 12 including deposition and in-situ doping of second portions of the Ge or SiGe nanowires according to the present disclosure.

Referring now to FIG. 12-15, another example for forming Ge or SiGe nanowires is shown. In FIG. 12, a first or bottom portion 212 of the Ge or SiGe nanowires 22 is deposited without doping. In FIG. 13, a second or middle portion 214 of the Ge or SiGe nanowires 22 is deposited using in-situ doping. In other words, the process gas mixture for depositing Ge or SiGe nanowires 22 further includes a precursor gas for a selected dopant species. In some examples, further deposition of the Ge or SiGe nanowires ends after the second portion is deposited. In other examples, a third or upper portion of the Ge or SiGe nanowires is deposited.

Figure 14:
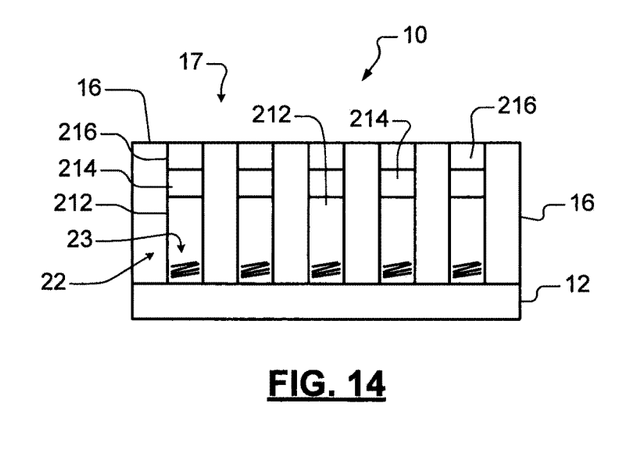
FIG. 14 is a side view illustrating the substrate of FIG. 13 including an undoped third or upper portion of the Ge or SiGe nanowires according to the present disclosure.
Figure 15:
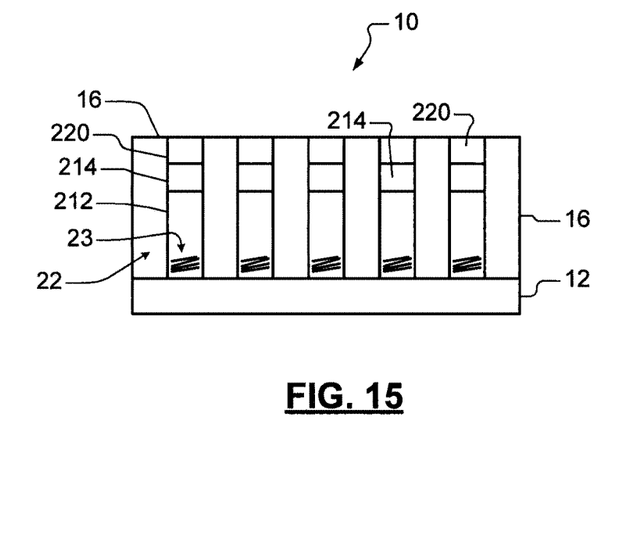
FIG. 15 is a side view illustrating the substrate of FIG. 13 including deposition and in-situ doping of a third or upper portion of the Ge or SiGe nanowires (with different doping species and/or concentration than in FIG. 13) according to the present disclosure.

In FIG. 14, a third or upper portion 216 of the Ge or SiGe nanowires 22 is deposited without doping. Alternately in FIG. 15, a third or upper portion 220 of the Ge or SiGe nanowires 22 is deposited with different doping (in other words, a different doping species and/or different doping concentration) than the second portion 214.

Figure 16:
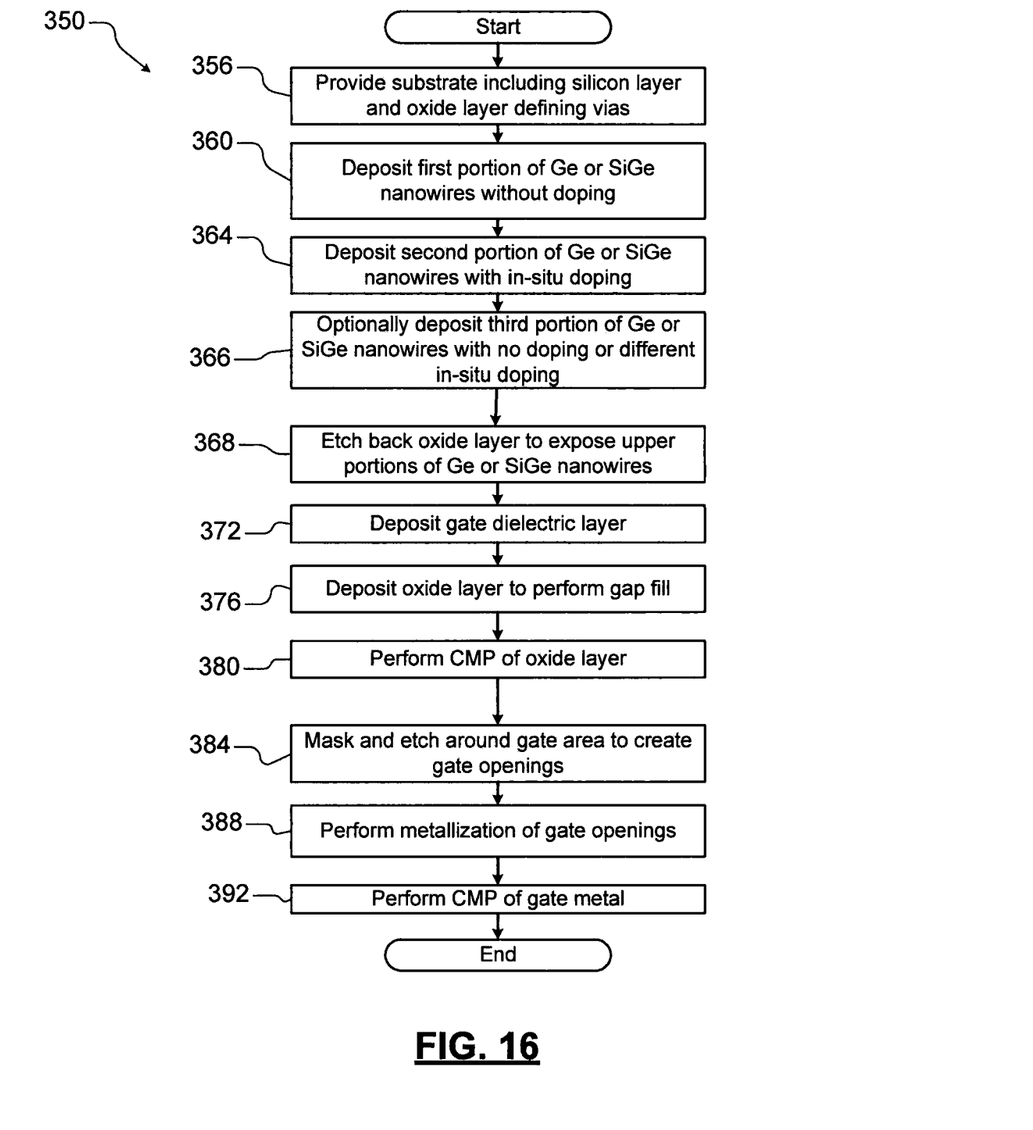
FIG. 16 is a flowchart illustrating another example of a method for forming Ge or SiGe nanowire devices according to the present disclosure.

Referring now to FIG. 16, a method 350 for forming devices with Ge or SiGe nanowires according to the present disclosure is shown. At 356, a substrate is provided that includes a silicon layer and oxide layer defining vias. At 360, a first portion of Ge or SiGe nanowires is deposited without doping to partially fill the vias. At 364, a second portion of the Ge or SiGe nanowires is deposited with in-situ doping using a first dopant species. At 366, a third portion of the Ge or SiGe nanowires is optionally deposited with no doping or with a second dopant species and/or concentration that is different than the first dopant species and/or concentration.

At 368, portions of the oxide layer are etched back to expose upper portions of the Ge or SiGe nanowires. At 372, a gate dielectric layer is deposited on the exposed upper portions of the Ge or SiGe nanowires. At 376, oxide film is deposited to fill gaps. At 380, CMP is performed on the oxide film. At 384, areas adjacent to the gate area are masked and etched to create gate openings. At 388, metallization is performed to fill the gate openings with gate metal. At 392, chemical mechanical polishing is performed on the gate metal.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for forming nanowire semiconductor devices, comprising:
   a) providing a substrate including an oxide layer defining vias;
   b) growing nanowires in the vias, wherein the nanowires are made of a material selected from a group consisting of germanium or silicon germanium;
   c) selectively etching back the oxide layer relative to the nanowires to expose upper portions of the nanowires; and
   d) doping the exposed upper portions of the nanowires using a dopant species.

2. The method of claim 1, further comprising:
   e) annealing the substrate.

3. The method of claim 1, wherein the nanowires are single-crystalline.

4. The method of claim 1, wherein the substrate includes:
   a silicon layer,
   wherein the oxide layer is deposited on the silicon layer and the oxide layer is patterned to define the vias.

5. The method of claim 1, further comprising:
   e) depositing gate dielectric layers on the exposed upper portions of the nanowires.

6. The method of claim 5, further comprising:
   f) depositing oxide film on the substrate to perform gap fill; and
   g) performing chemical mechanical polishing of the oxide film.

7. The method of claim 6, further comprising:
   h) defining masked and unmasked areas in the oxide film, wherein the unmasked areas are located adjacent to gate areas corresponding to the gate dielectric layers; and
   i) etching the unmasked areas to create gate openings.

8. The method of claim 7, further comprising:
   j) performing metallization to fill the gate openings with gate metal; and
   k) performing chemical mechanical polishing on the gate metal.

9. The method of claim 1, wherein the doping in d) is performed using a process selected from a group consisting of a plasma process and an atomic layer deposition (ALD) process.

10. The method of claim 5, wherein depositing gate dielectric layers in e) is performed using an atomic layer deposition (ALD) process.

* * * * *